(12) United States Patent
Marr et al.

(10) Patent No.: US 7,405,463 B2
(45) Date of Patent: *Jul. 29, 2008

(54) GATE DIELECTRIC ANTIFUSE CIRCUIT TO PROTECT A HIGH-VOLTAGE TRANSISTOR

(75) Inventors: Kenneth W. Marr, Boise, ID (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/426,523

(22) Filed: Jun. 26, 2006

(65) Prior Publication Data

US 2006/0231922 A1 Oct. 19, 2006

Related U.S. Application Data

(60) Continuation of application No. 10/931,366, filed on Aug. 31, 2004, now Pat. No. 7,101,738, which is a division of application No. 10/230,928, filed on Aug. 29, 2002, now Pat. No. 6,936,909.

(51) Int. Cl.
*H01L 29/04* (2006.01)
*H01L 29/10* (2006.01)
*H01L 31/036* (2006.01)

(52) U.S. Cl. .............................. 257/530; 257/E23.147
(58) Field of Classification Search ........................ None
See application file for complete search history.

(56) References Cited

U.S. PATENT DOCUMENTS

| | | | |
|---|---|---|---|
| 4,748,490 A | 5/1988 | Hollingsworth | |
| 5,110,754 A | 5/1992 | Lowrey et al. | |
| 5,194,759 A | 3/1993 | El-Ayat et al. | |
| 5,282,158 A | 1/1994 | Lee | |
| 5,299,150 A | 3/1994 | Galbraith et al. | |
| 5,376,566 A | 12/1994 | Gonzales | |
| 5,379,250 A | 1/1995 | Harshfield | |
| 5,439,835 A | 8/1995 | Gonzales | |
| 5,646,879 A | 7/1997 | Harshfield | |
| 5,661,045 A | 8/1997 | Manning et al. | |
| 5,714,786 A | 2/1998 | Gonzales et al. | |
| 5,724,282 A | 3/1998 | Loughmiller et al. | |

(Continued)

OTHER PUBLICATIONS

Candelier, P., et al., "One Time Programmable Drift Antifuse Cell Reliability", *IEEE International Reliability Physics Symposium Proceedings*, San Jose, Ca,(2000),169-173.

(Continued)

*Primary Examiner*—Evan Pert
*Assistant Examiner*—Ben P Sandvik
(74) *Attorney, Agent, or Firm*—Schwegman, Lundberg & Woessner, P.A.

(57) ABSTRACT

According to embodiments of the present invention, circuits have elements to protect a high-voltage transistor in a gate dielectric antifuse circuit. An antifuse has a layer of gate dielectric between a first terminal coupled to receive an elevated voltage and a second terminal, and a high-voltage transistor is coupled to the antifuse and has a gate terminal. An intermediate voltage between the supply voltage and the elevated voltage is coupled to the gate terminal of the high-voltage transistor to protect the high-voltage transistor.

20 Claims, 14 Drawing Sheets

U.S. PATENT DOCUMENTS

| | | | |
|---|---|---|---|
| 5,741,720 | A | 4/1998 | Hawley et al. |
| 5,742,555 | A | 4/1998 | Marr et al. |
| 5,748,025 | A | 5/1998 | Ng et al. |
| 5,789,796 | A | 8/1998 | Kang et al. |
| 5,811,869 | A | 9/1998 | Seyyedy et al. |
| 5,818,778 | A | 10/1998 | Lui et al. |
| 5,838,620 | A | 11/1998 | Zagar et al. |
| 5,859,543 | A | 1/1999 | Kolze |
| 5,978,248 | A | 11/1999 | Marr et al. |
| 5,990,021 | A | 11/1999 | Prall et al. |
| 5,998,274 | A | 12/1999 | Akram et al. |
| 6,005,273 | A | 12/1999 | Gonzales et al. |
| 6,011,289 | A | 1/2000 | Huang et al. |
| 6,011,742 | A | 1/2000 | Zheng |
| 6,041,008 | A | 3/2000 | Marr |
| 6,088,282 | A | 7/2000 | Loughmiller et al. |
| 6,090,693 | A | 7/2000 | Gonzales et al. |
| 6,194,756 | B1 | 2/2001 | Gonzales |
| 6,233,194 | B1 | 5/2001 | Marr et al. |
| 6,252,293 | B1 | 6/2001 | Seyyedy et al. |
| 6,252,422 | B1 | 6/2001 | Patel et al. |
| 6,255,837 | B1 | 7/2001 | Habersetzer et al. |
| 6,271,071 | B1 | 8/2001 | Gonzales |
| 6,285,062 | B1 | 9/2001 | Marr |
| 6,300,188 | B1 | 10/2001 | Gonzales |
| 6,384,666 | B1 | 5/2002 | Bertin et al. |
| 6,448,603 | B2 | 9/2002 | Gonzales |
| 6,456,149 | B2 | 9/2002 | Cutter et al. |
| 6,515,344 | B1 | 2/2003 | Wollesen |
| 6,515,931 | B2 | 2/2003 | Marr et al. |
| 6,545,928 | B1 | 4/2003 | Bell |
| 6,570,805 | B2 | 5/2003 | McCollum |
| 6,630,724 | B1 | 10/2003 | Marr |
| 6,751,150 | B2 | 6/2004 | Marr et al. |
| 6,936,909 | B2 | 8/2005 | Marr et al. |
| 7,030,458 | B2 | 4/2006 | Marr |
| 7,101,738 | B2 | 9/2006 | Marr et al. |
| 7,126,871 | B2 | 10/2006 | Marr et al. |
| 2001/0051407 | A1 | 12/2001 | Tran |
| 2001/0054740 | A1 | 12/2001 | Marr |
| 2002/0027822 | A1 | 3/2002 | Candelier et al. |
| 2003/0214841 | A9 | 11/2003 | Scheuerlein et al. |
| 2004/0042317 | A1 | 3/2004 | Marr et al. |
| 2005/0029598 | A1 | 2/2005 | Marr et al. |
| 2006/0097345 | A1 | 5/2006 | Marr |

OTHER PUBLICATIONS

Dabral, Sanjay, et al., *Basic ESD and I/O Design*. (1998),pp. 272.

Dabral, S., et al., *Basic ESD and I/O design*, John Wiley & Sons, Inc, New York,(1998),pp. 260-263.

De Graaf, C., et al., "A Novel High-Density Low-Cost Diode Programmable Read Only Memory", *IEDM Technical Digest*, San Francisco, Ca,(1996),pp. 189-192.

Dobberpuhl, D. W., et al., "A 200-MHz 64-b Dual-Issue CMOS Microprocessor", *IEEE Journal of Solid-State Circuits, 27(11)*, (1992),1555-1567.

Hamdy, E., et al., "Dielectric based antifuse for logic and memory ICs", *IEDM*, San Francisco, Ca,(1988),pp. 786-789.

Hower, P. L., et al., "Snapback and Safe Operating Area of Ldmos Transistors", *IEDM*, (1999),pp. 193-196.

Kalnitsky, A., et al., "CoSi2 integrated fuses on poly silicon for low voltage 0.18 micrometer CMOS applications", *IEDM*, (1999),pp. 765-768.

Lee, H., et al., "THPM 13.4: An Experimental 1 Mb CMOS SRAM with Configurable Organization and Operation", *IEEE International Solid-State Circuits Conference*, (1988),pp. 180-181, 359.

Ludikhuize, A. W., et al., "Analysis of hot-carrier-induced degradation and snapback in submicron 50V lateral MOS transistors", *IEEE*, (1997),pp. 53-56.

Marr, Kenneth W., et al., "A Method of Anti-fuse Repair", U.S. Appl. No. 09/845,794, filed Apr. 30, 2001.

Marr, Ken W., "Adjustable High-Trigger-Voltage Electrostatic Discharge Protection Device", U.S. Appl. No. 09/933,379, filed May 12, 1999.

Marr, Kenneth W., et al., "Antifuse Structure and Method of Use", U.S. Appl. No. 09/515,760, filed on Mar. 1, 2000.

Schroder, H U., et al., "High Voltage resistant ESD protection circuitry of 0.5um CMOS OTP/EPROM programming pin", *EOS/ESD Symposium*, (1998),pp. 2A.6.1-2A.6.8.

Voldman, S. H., "ESD Protection in a Mixed Voltage Interface and Multi-Rail Diconnected Power Grid Environment in 0.50- and 0.25-micrometer Channel Length CMOS Technologies", *EOS/ESD Symposium*, (1994),pp. 125-134.

GATE DIELECTRIC ANTIFUSE CIRCUIT TO PROTECT A HIGH-VOLTAGE TRANSISTOR

RELATED APPLICATIONS

This application is a continuation of U.S. application Ser. No. 10/931,366, filed Aug. 31, 2004, now U.S. Pat. No. 7,101, 738 which is a divisional of U.S. application Ser. No. 10/230, 928, filed Aug. 29, 2002, now U.S. Pat. No. 6,936,909, both of which are incorporated herein by reference.

FIELD OF THE INVENTION

The present invention relates generally to integrated circuits, and more particularly, to a gate dielectric antifuse circuit to protect a high-voltage transistor.

BACKGROUND

Integrated circuits are interconnected networks of electrical components fabricated on a common foundation called a substrate. The electrical components are typically fabricated on a wafer of semiconductor material that serves as a substrate. Various fabrication techniques, such as layering, doping, masking, and etching, are used to build millions of resistors, transistors, and other electrical components on the wafer. The components are then wired together, or interconnected, to define a specific electrical circuit, such as a processor or a memory device.

Fusible elements are employed in integrated circuits to permit changes in the configuration of the integrated circuits after fabrication. For example, fusible elements may be used to replace defective circuits with redundant circuits. Memory devices are typically fabricated with redundant memory cells. The redundant memory cells may be enabled with fusible elements after fabrication to replace defective memory cells found during a test of fabricated memory devices. Fusible elements are also used to customize the configuration of a generic integrated circuit after it is fabricated, or to identify an integrated circuit.

One type of fusible element is a polysilicon fuse. The polysilicon fuse comprises a polysilicon conductor fabricated to conduct electrical current on an integrated circuit. A portion of the polysilicon fuse may be evaporated or opened by a laser beam to create an open circuit between terminals of the polysilicon fuse. The laser beam may be used to open selected polysilicon fuses in an integrated circuit to change its configuration. The use of polysilicon fuses is attended by several disadvantages. Polysilicon fuses must be spaced apart from each other in an integrated circuit such that when one of them is being opened by a laser beam the other polysilicon fuses are not damaged. A bank of polysilicon fuses therefore occupies a substantial area of an integrated circuit. In addition, polysilicon fuses cannot be opened once an integrated circuit is placed in an integrated circuit package, or is encapsulated in any manner.

Another type of fusible element is an antifuse. An antifuse comprises two conductive terminals separated by an insulator or a dielectric, and is fabricated as an open circuit. The antifuse is programmed by applying a high voltage across its terminals to rupture the insulator and form an electrical path between the terminals.

Antifuses have several advantages that are not available with fuses. A bank of antifuses takes up much less area of an integrated circuit because they are programmed by a voltage difference that can be supplied on wires connected to the terminals of each of the antifuses. The antifuses may be placed close together in the bank, and adjacent antifuses are not at risk when one is being programmed. Antifuses may also be programmed after an integrated circuit is placed in an integrated circuit package, or encapsulated, by applying appropriate signals to pins of the package. This is a significant advantage for several reasons. First, an integrated circuit may be tested after it is in a package, and may then be repaired by replacing defective circuits with redundant circuits by programming selected antifuses. A generic integrated circuit may be tested and placed in a package before it is configured to meet the specifications of a customer. This reduces the delay between a customer order and shipment. The use of antifuses to customize generic integrated circuits also improves the production yield for integrated circuits because the same generic integrated circuit may be produced to meet the needs of a wide variety of customers.

Despite their advantages, the use of antifuses in integrated circuits is limited by a lack of adequate circuitry to support the programming and reading of the antifuses. There exists a need for improved circuits and methods for programming and reading antifuses in integrated circuits.

DETAILED DESCRIPTION

Figure 1:
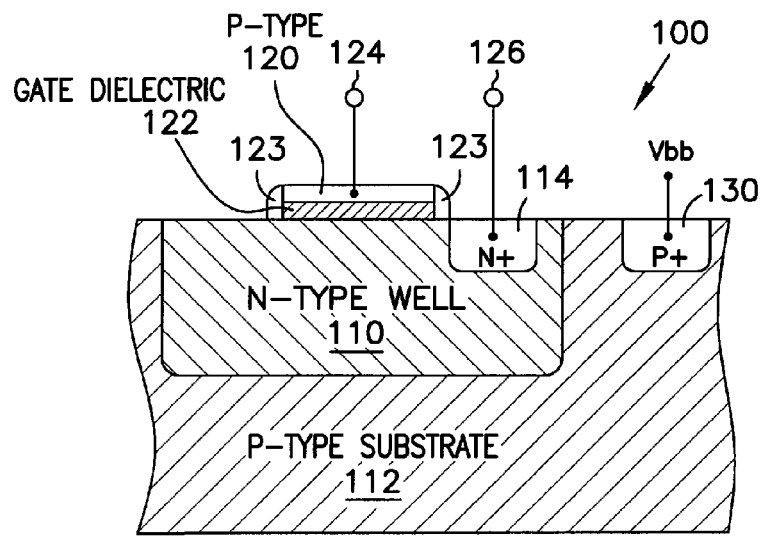
FIG. 1 is a cross-sectional view of an antifuse according to an embodiment of the present invention.

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

The terms wafer and substrate may be used in the following description and include any structure having an exposed surface with which to form an integrated circuit (IC) according to embodiments of the present invention. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art.

The term "horizontal" is defined as a plane substantially parallel to the conventional plane or surface of a wafer or substrate, regardless of the orientation of the wafer or substrate. The term "vertical" refers to a direction substantially perpendicular to the horizontal as defined above. Prepositions, such as "on," "upper," "side" (as in "sidewall"), "higher," "lower," "over," and "under" are defined with respect to the conventional plane or surface being on the top surface of the wafer or substrate, regardless of the orientation of the wafer or substrate. The prepositions "on," "upper," "side," "higher," "lower," "over," and "under" are thereby defined with respect to "horizontal" and "vertical."

Antifuses and transistors described herein according to embodiments of the present invention may have wells that may be formed in other wells or tanks rather than substrates. Such wells or tanks may be situated with other wells or tanks, or within other wells or tanks, in a larger substrate. The wells or tanks may also be situated in a silicon-on-insulator (SOI) device.

The term "source/drain" refers generally to the terminals or diffusion regions of a field effect transistor. A terminal or a diffusion region may be more specifically described as a "source" or a "drain" on the basis of a voltage applied to it when the field effect transistor is in operation.

P-type conductivity is conductivity associated with holes in a semiconductor material, and n-type conductivity is conductivity associated with electrons in a semiconductor material. Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n and p-type semiconductor materials, respectively.

In this description a transistor is described as being activated or switched on when it is rendered conductive by a control gate voltage that is separated from its source voltage by at least its threshold voltage. The transistor is described as being in an inactive state or switched off when the control gate voltage is separated from its source voltage by less than the threshold voltage and the transistor is rendered non-conductive. A digital signal of 1 may be called a high signal and a digital signal of 0 may be called a low signal. Embodiments of the present invention described herein may be coupled to receive a power supply voltage Vcc which is within approximately 1 to 5 volts. By way of example in this description, and not by way of limitation, Vcc is approximately 3 volts. Embodiments of the present invention described herein may be coupled to receive a ground voltage reference Vss, and a bulk node voltage Vbb. The voltage Vbb may be approximately equal to Vss, or may be slightly less than Vss such as approximately minus 1 to minus 2 volts. Vbb is often coupled to p-type wells and p-type substrates in integrated circuits described herein. Vcc, Vss, and Vbb are received directly or are generated by circuits that are not shown for purposes of brevity, but are known to those skilled in the art.

A cross-sectional view of an antifuse 100 according to an embodiment of the present invention is shown in FIG. 1. An n-type well 110 is formed in a p-type substrate 112, and an n+-type diffusion region 114 is formed in the well 110. The n+-type diffusion region 114 provides an ohmic contact for the well 110. A p-type gate electrode 120 is formed over a layer of gate dielectric 122 which is formed over the well 110. One or more spacers 123 are formed on the sides of the gate dielectric 122 and the gate electrode 120. The gate electrode 120 is connected to a first terminal 124 of the antifuse 100, and a second terminal 126 is connected to the n+-type diffusion region 114. In alternate embodiments of the present invention the gate electrode 120 comprises polysilicon or layers of polysilicon and a silicide such as tungsten silicide ($WSi_x$), titanium silicide ($TiSi_2$), or cobalt silicide ($CoSi_2$). The gate dielectric 122 may be oxide, oxynitride, or nitrided oxide. A p+-type diffusion region 130 is formed in the substrate 112 to provide an ohmic contact coupling the substrate 112 to Vbb.

Two separate circuits in an integrated circuit may be connected respectively to the first and second terminals 124, 126 of the antifuse 100. The antifuse 100 is an open circuit between the terminals until it is programmed in the following manner. The p-type substrate 112 is coupled to Vbb and the first terminal 124 attached to the p-type gate electrode 120 is coupled to a positive elevated voltage, such as approximately 7-8 volts. The second terminal 126 is coupled to bring the well 110 to a low voltage. A voltage drop between the well 110 and the p-type gate electrode 120 is enough to rupture the gate dielectric 122. When programmed the antifuse 100 has a conductive connection between the first and second terminals 124, 126 which may be biased appropriately such that the p-n junction between the p-type gate electrode 120 and the well 110 allows current to flow. The programmed antifuse 100 is an impedance element between the circuits.

The gate dielectric 122 may be fabricated to be thinner than gate dielectrics in conventional field effect transistors to reduce the voltage drop necessary to rupture the gate dielectric 122. The antifuse 100 with a thinner gate dielectric 122 would be programmable with a lower elevated voltage, and thus reduce the effects of the elevated voltage on neighboring circuits. The antifuse 100 may be formed in a semiconductor layer formed over an insulator according to alternate embodiments of the present invention.

The antifuse 100 described above may be used for a variety of purposes in an integrated circuit. For example, the antifuse 100 may be programmed to provide a coupling to redundant circuits, to change a configuration of the integrated circuit, to tie a line to a voltage or to Vss, to change the timing of the integrated circuit, or to provide identification for the integrated circuit. The integrated circuit may be a memory device, a processor, or any other type of integrated circuit device by way of example and not by way of limitation. One or more registers of the antifuse 100 may be programmed to comprise an electrically programmable read-only memory (EPROM).

A large number of antifuses such as the antifuse 100 described above are arranged in banks of antifuses in an integrated circuit. A single antifuse bank 200 in an integrated circuit is shown in a block diagram in FIG. 2 according to an embodiment of the present invention. An antifuse 210 has a first terminal coupled to an external pin 220 through a common bus line 230, and a second terminal coupled to a program driver circuit 242. The antifuse 210 has the structure and operational method of the antifuse 100 described above, and is represented by a triangle inscribed with the letter A. The program driver circuit 242 is used to select the antifuse 210 to be programmed during a programming mode of operation. A read circuit 244 is coupled to the antifuse 210 through the program driver circuit 242 to read a state of the antifuse 210 during an active mode of operation. A gate bias circuit 254 is coupled between the external pin 220 through the common bus line 230 and the program driver circuit 242.

The antifuse 210, the program driver circuit 242, and the read circuit 244 comprise a single antifuse module 260 in the antifuse bank 200. Other antifuse modules 262 and 264 each include a single antifuse coupled to a program driver circuit and a read circuit similar to those elements in the antifuse module 260. The gate bias circuit 254 is coupled between the common bus line 230 and the program driver circuits in each of the antifuse modules 260, 262, and 264 according to the embodiment of the present invention. The antifuse bank 200 includes other antifuse modules similar to the antifuse module 260 which are not shown for purposes of brevity. The antifuse bank 200 may include hundreds or thousands of antifuse modules similar to the antifuse module 260, each antifuse module being coupled to the gate bias circuit 254 which is a global circuit in the antifuse bank 200.

During the programming mode, an elevated voltage is applied to the external pin 220 and the common bus line 230 that exceeds Vcc of the integrated circuit by a substantial amount. The elevated voltage provides the potential necessary to rupture the gate dielectrics of antifuses selected to be programmed. The elevated voltage is removed from the external pin 220 during the active mode and during a sleep mode of operation and the integrated circuit operates from Vcc. In the active and sleep modes the external pin 220 may be coupled to Vcc or to another read voltage. The use of the external pin 220 to couple the elevated voltage to the antifuse 210 during the programming mode substantially protects other portions of the integrated circuit from damage that may be caused by the elevated voltage.

The gate bias circuit 254 is coupled to a program driver circuits for each of the other antifuse modules in the antifuse bank 200 to bias a gate of a transistor in each program driver circuit as will be described hereinbelow. The integrated circuit includes many antifuse banks similar to the antifuse bank 200 according to alternate embodiments of the present invention.

Figure 3:
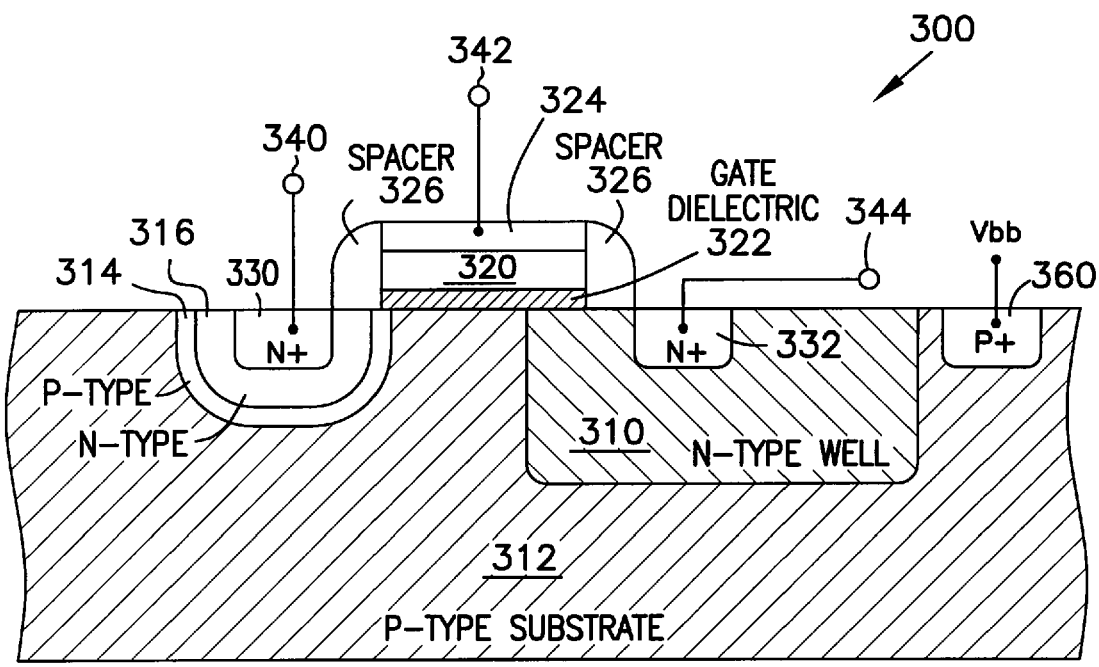
FIG. 3 is a cross-sectional view of a high-voltage transistor according to an embodiment of the present invention.

The gate bias circuit 254 and the program driver circuit 242 each include at least one high-voltage transistor (HVT). One example of such a HVT is an n-well drain transistor 300, a cross-sectional view of which is shown in FIG. 3 according to an embodiment of the present invention. An n-type well 310 is formed in a drain side of a p-type substrate 312, and a p-type halo implant 314 is formed in a source side of the substrate 312. An n-type lightly doped drain (LDD) 316 is implanted inside the halo implant 314. A gate 320 is formed over a layer of gate dielectric 322 which is formed over the substrate 312 between the n-type well 310 and the halo implant 314. An electrode 324 is formed over the gate 320. In alternate embodiments of the present invention the gate 320 may comprise polysilicon and the electrode 324 may comprise a silicide such as tungsten silicide ($WSi_x$), titanium silicide ($TiSi_2$), or cobalt silicide ($CoSi_2$). The gate dielectric 322 may be oxide, oxynitride, or nitrided oxide. The gate 320 and the electrode 324 may also comprise metal. One or more spacers 326 are then formed on the sides of the gate dielectric 322, the gate 320, and the electrode 324. An n+-type source diffusion region 330 is implanted inside the LDD 316 and the halo implant 314. Also, an n+-type drain diffusion region 332 is implanted in the n-type well 310. The drain diffusion region 332 is not surrounded by LDD or halo implants which are blocked from the drain side of the substrate 312. A source terminal 340 is connected to the source diffusion region 330, a gate terminal 342 is connected to the electrode 324, and a drain terminal 344 is connected to the drain diffusion region 332. A p+-type diffusion region 360 is formed in the substrate 312 to provide an ohmic contact coupling the substrate 312 to Vbb.

The n-well drain transistor 300 has a high drain breakdown voltage. In operation the substrate 312 is coupled to Vbb and the drain terminal 344 is coupled to a line with a high positive voltage, such as the common bus line 230 shown in FIG. 2 during the programming mode. The n-well drain transistor 300 will break down and allow current to flow between the drain terminal 344 and the substrate 312 when a critical electric field intensity (E) is reached across a boundary between the n-type well 310 and the p-type substrate 312. E may be approximated as the voltage drop across the boundary divided by a width of a depletion region at the boundary of the n-type well 310 and the p-type substrate 312. Dopant concentrations in the n-type well 310 and the p-type substrate 312 are relatively low such that the width of the depletion region between the two is relatively large. The boundary will not break down even under a very large voltage drop across the boundary because the E is less than the critical E. As a result, the n-well drain transistor 300 will not break down even if the voltage on the drain terminal 344 is relatively high. In contrast, an ordinary n-channel transistor does not have the n-type well 310, and there is a boundary between a p-type substrate and an n+-type drain diffusion region with a very high dopant concentration. A depletion region at this boundary is not very wide, and as a consequence it will break down under a smaller voltage.

Figure 4:
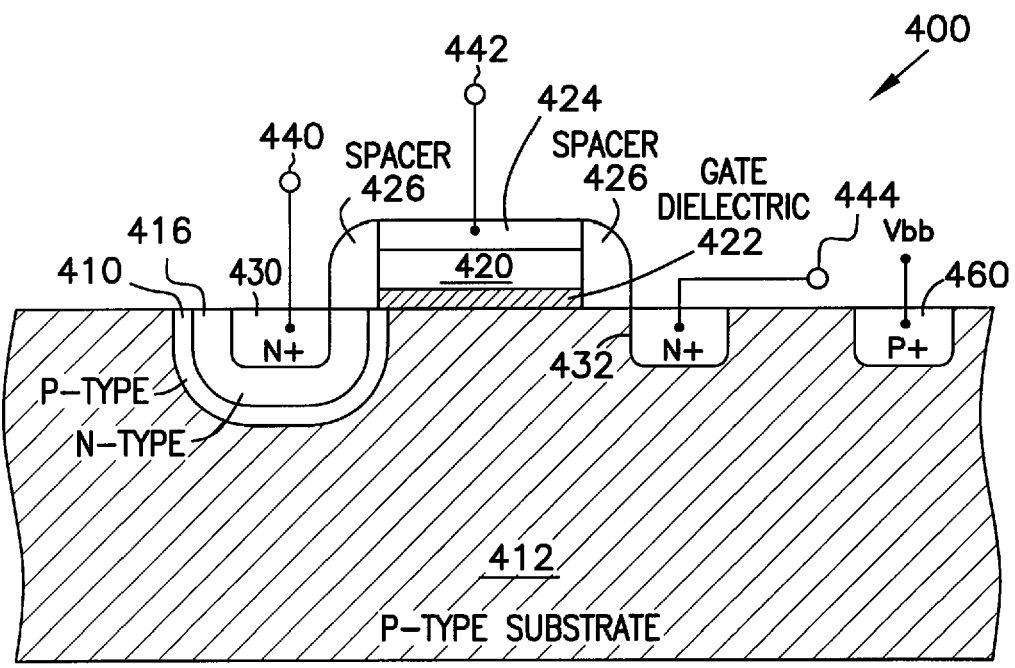
FIG. 4 is a cross-sectional view of a high-voltage transistor according to an embodiment of the present invention.

A cross-sectional view of an n-channel transistor 400 is shown in FIG. 4 according to an embodiment of the present invention. The transistor 400 is a HVT. A gate 420 is formed over a layer of gate dielectric 422 which is formed over a p-type substrate 412. An electrode 424 is formed over the gate 420. A p-type halo implant 410 is formed in a source side of the substrate 412. An n-type lightly doped drain (LDD) 416 is implanted inside the halo implant 410. In alternate embodiments of the present invention the gate 420 comprises polysilicon and the electrode 424 may comprise a silicide such as tungsten silicide ($WSi_x$), titanium silicide ($TiSi_2$), or cobalt silicide ($CoSi_2$). The gate 420 and the electrode 424 may comprise metal. The gate dielectric 422 may be oxide, oxynitride, or nitrided oxide. One or more spacers 426 are then formed on the sides of the gate dielectric 422, the gate 420, and the electrode 424. An n+-type source diffusion region 430 is implanted inside the LDD 416 and the halo implant 410. Also, an n+-type drain diffusion region 432 is implanted in the substrate 412. The drain diffusion region 432 is not surrounded by LDD or halo implants which are blocked from a drain side of the substrate 412. A source terminal 440 is connected to the source diffusion region 430, a gate terminal 442 is connected to the electrode 424, and a drain terminal 444 is connected to the drain diffusion region 432. The drain diffusion region 432 and the source diffusion region 430 are self-aligned with the spacers 426. A p+-type diffusion region 460 is formed in the substrate 412 to provide an ohmic contact coupling the substrate 412 to Vbb. In another embodiment of the present invention, an added mask and implant could be applied to the drain diffusion region 432 to customize the high drain breakdown voltage of the n-channel transistor 400. The n-channel transistor 400 has a high drain breakdown voltage and may be used in embodiments of the present invention described above in place of the n-well drain transistor 300 shown in FIG. 3.

The transistors 300 and 400 shown in FIGS. 3 and 4 may be fabricated according to process steps used to fabricate field-effect transistors in an integrated circuit, and do not require extra process steps.

Figure 2:
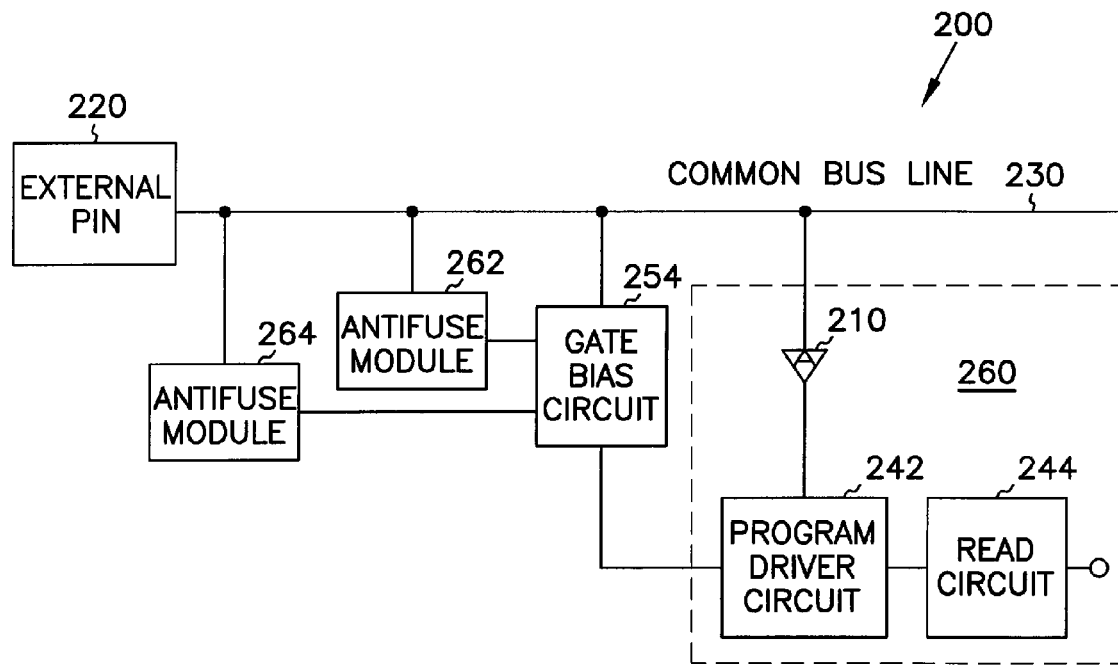
FIG. 2 is a block diagram of support circuits for antifuses according to an embodiment of the present invention.
Figure 5A:
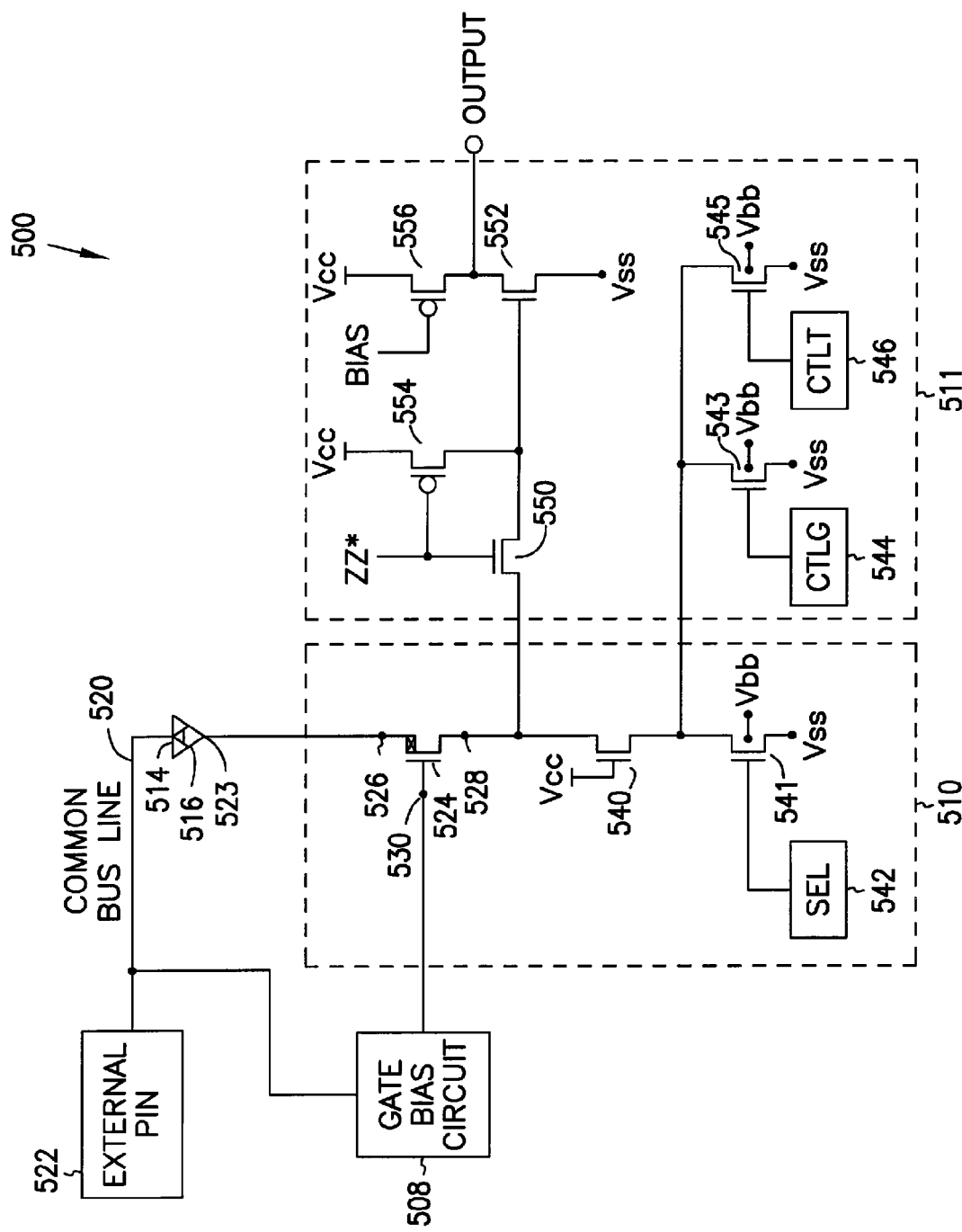
FIG. 5A is an electrical schematic diagram of support circuits for antifuses according to an embodiment of the present invention.

Several of the circuits in the antifuse bank 200 shown in FIG. 2 are shown in greater detail in FIG. 5A. An electrical schematic diagram of several support circuits 500 for programming and reading antifuses is shown in FIG. 5A according to an embodiment of the present invention. The circuits 500 include a gate bias circuit 508, a program driver circuit 510, and a read circuit 511. A gate electrode 514 of an antifuse 516 is coupled through a common bus line 520 to an external pin 522, and the program driver circuit 510 is coupled to a well 523 of the antifuse 516. The antifuse 516 is similar in structure and operation to the antifuse 100 shown in FIG. 1. The gate bias circuit 508 is coupled to other program driver circuits (not shown) in the antifuse bank 200.

The gate electrode 514 or the well 523 of the antifuse 516 may be coupled to the common bus line 520, with the other end of the antifuse 516 being coupled to the program driver circuit 510 according to alternate embodiments of the present invention. The antifuse 516 may be coupled to the common bus line 520 such that, if it has a p/n junction of p-type material and n-type material after being programmed, the p/n junction will be forward biased during the active mode of operation to present a low impedance to current flow.

The program driver circuit 510 includes a HVT 524 having a drain terminal 526, a source terminal 528, and a gate terminal 530. The HVT 524 is similar in structure and operating characteristics to the n-channel transistor 400 shown in FIG. 4. The drain terminal 526 is coupled to the well 523 of the antifuse 516. The gate terminal 530 is coupled to the gate bias circuit 508, and the gate bias circuit 508 is coupled to the common bus line 520 and the external pin 522. Current will flow through the HVT 524 as long as the other elements of the circuits 500 allow current to flow, as will be described hereinbelow. The gate bias circuit 508 couples the gate terminal 530 to a selected voltage as will be described hereinbelow.

The program driver circuit 510 also includes a first n-channel transistor 540 and a second n-channel transistor 541 coupled in cascode between the source terminal 528 and Vss. A gate terminal of the transistor 540 is coupled to Vcc, and the transistor 540 is switched on as long as Vcc exceeds a voltage at its source terminal by a threshold voltage $V_T$ of the transistor 540. A gate terminal of the transistor 541 is coupled to a select logic circuit SEL 542 that controls the program driver circuit 510 during the programming, active, and sleep modes. A body terminal of the transistor 541 is coupled to Vbb. The transistor 541 is switched off by the logic circuit SEL 542 in each of the programming, active, and sleep modes, and is switched on for a short period to program the antifuse 516 during the programming mode.

An n-channel transistor 543 is coupled in parallel with the transistor 541 between the transistor 540 and Vss. A gate terminal of the transistor 543 is coupled to a control logic circuit CTLG 544 that controls current through the transistor 543. The transistor 543 is a long-L transistor that may conduct between approximately 0.06 and 1 microamps, and is switched on by the control logic circuit CTLG 544 during the active mode as will be described hereinbelow.

An n-channel transistor 545 is coupled in parallel with the transistors 541 and 543 between the transistor 540 and Vss. A gate terminal of the transistor 545 is coupled to a control logic circuit CTLT 546 that controls current through the transistor 545. The transistor 545 is a short-L transistor that may conduct between approximately 1-28 microamps, and is switched on by the control logic circuit CTLT 546 during the active mode as will be described hereinbelow.

The common bus line 520 is coupled to receive an elevated voltage during the programming mode, for example approximately 7-8 volts, through the external pin 522. Before the antifuse 516 is programmed the elevated voltage on the common bus line 520 is distributed across the antifuse 516, and the transistors 524, 540, 541, 543, and 545 which are non-linear elements. Each of the antifuse 516 and the transistors 524, 540, 541, 543, and 545 in the program driver circuit 510 bears a portion of the elevated voltage in a manner similar to a capacitor divider circuit. The distribution of the elevated voltage is non-linear and may vary over time. When the antifuse 516 is programmed, it is an impedance element and the distribution of the elevated voltage changes. Voltages along the program driver circuit 510 rise as the antifuse 516 is programmed, and the elevated voltage is distributed across the antifuse 516 and the transistors 524, 540, 541, 543, and 545 in a manner similar to a resistor divider circuit. Each of the antifuse 516 and the transistors 524, 540, 541, 543, and 545 bears a portion of the elevated voltage.

Figure 6:
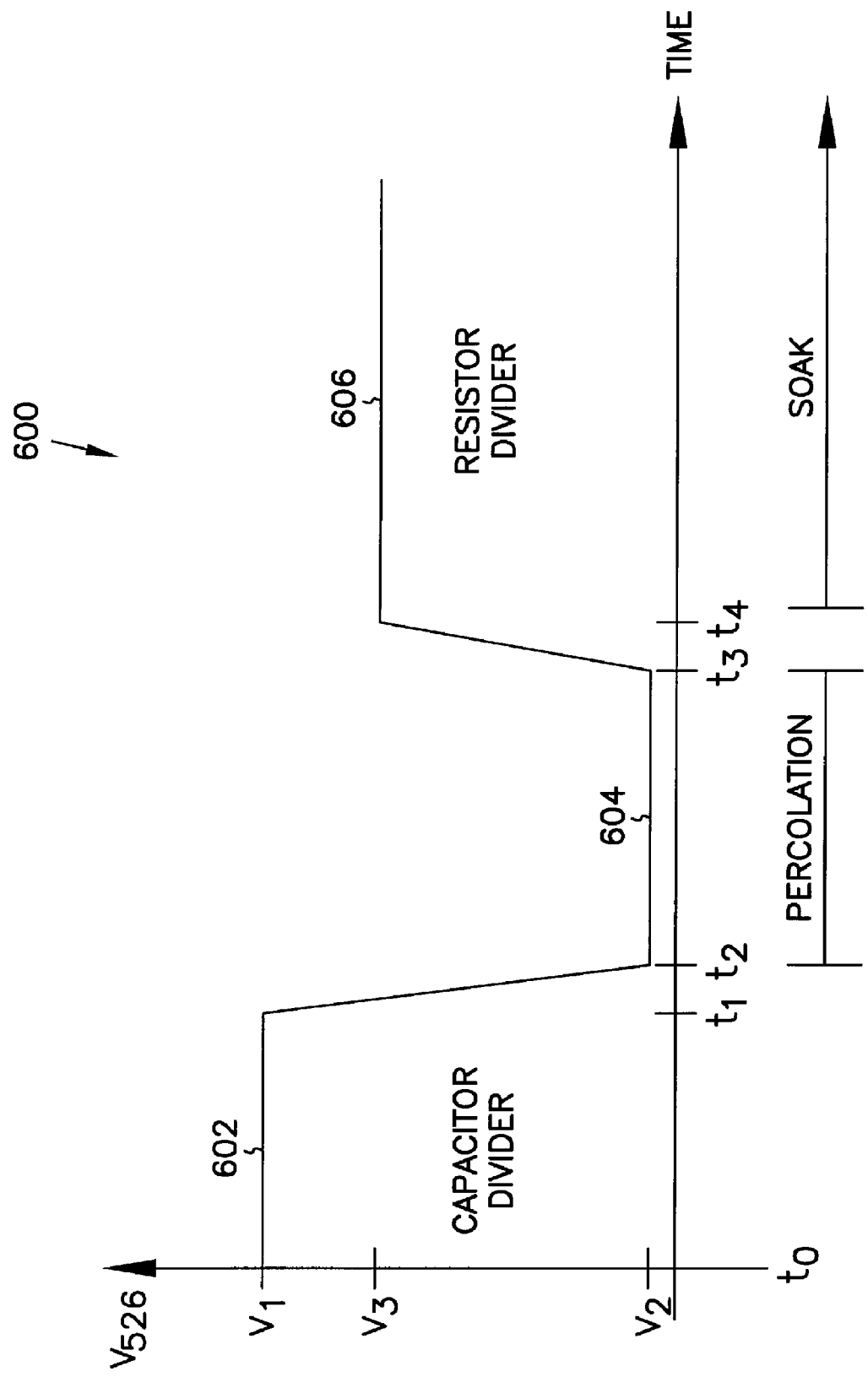
FIG. 6 is a timing diagram for programming an antifuse according to an embodiment of the present invention.

The antifuse 516 may be selected to be programmed by the logic circuit SEL 542 by switching on the transistor 541 to conduct current from the common bus line 520 through to Vss. The transistor 541 is switched on for a short period of time to allow the elevated voltage on the common bus line 520 to rupture a gate dielectric in the antifuse 516, and is then switched off. A timing diagram 600 of a voltage $V_{526}$ at the drain terminal 526 of the HVT 524 during the programming of the antifuse 516 is shown in FIG. 6 according to an embodiment of the present invention. The voltage $V_{526}$ is shown on a vertical axis and time is shown on a horizontal axis. Starting at a time $t_0$ the voltage $V_{526}$ is high at $V_1$ and the program driver circuit 510 behaves as a capacitor divider circuit during a period 602 until a time $t_1$ when the transistor 541 is switched on. The voltage $V_{526}$ then falls quickly to a low voltage $V_2$ that is near Vss. The antifuse 516 undergoes a percolation period 604 between times $t_2$ and $t_3$ and remains intact under a significant voltage drop between the elevated voltage and $V_2$. The percolation period may last approximately from ½ to 1 microsecond. The gate dielectric in the antifuse 516 ruptures between times $t_3$ and $t_4$ and the voltage $V_{526}$ rises to $V_3$ after time $t_4$. The antifuse 516 is an impedance element after time $t_4$ and the program driver circuit 510 bears the elevated voltage in a manner similar to a resistor divider circuit. The transistor 541 remains switched on after time $t_4$ during a soak period 606 of approximately 10 milliseconds to permit a delivered energy to thoroughly rupture the gate dielectric in the antifuse 516. The energy delivered to the gate dielectric is approximately equal to the current through the antifuse 516 during the soak period 606 multiplied by the voltage drop across the antifuse 516 and divided by the time of the soak period 606. The voltage $V_{526}$ remains at $V_3$ during the soak period 606 while the transistor 541 is switched on.

The read circuit 511 includes elements used to read a state of the antifuse 516, and these elements will now be described according to an embodiment of the present invention. The read circuit 511 also includes the transistor 543, the control logic circuit CTLG 544, the transistor 545, and the control logic circuit CTLT 546. The program driver circuit 510 is also coupled to the read circuit 511 through an n-channel pass-gate transistor 550. A drain of the pass-gate transistor 550 is coupled to the source terminal 528 of the HVT 524, and a source of the pass-gate transistor 550 is coupled to a gate of an n-channel transistor 552. A sleep signal ZZ* is coupled to a gate of the pass-gate transistor 550 and to a gate of a p-channel transistor 554. The sleep signal ZZ* is an active-low signal that is high during the active mode to switch on the pass-gate transistor 550 and low during the sleep mode to switch off the pass-gate transistor 550. The transistor 554 has a source coupled to Vcc and a drain coupled to the source of the pass-gate transistor 550 and the gate of the transistor 552. The transistor 552 has a source coupled to Vss and a drain coupled to a drain of a p-channel transistor 556. A source of the transistor 556 is coupled to Vcc. A gate of the transistor 556 is coupled to a bias signal BIAS, which configures the transistor 556 as a bandgap-based current source. The drains of the transistors 552 and 556 generate an output signal OUTPUT at an output indicating the state of the antifuse 516 during the active mode.

During the active and sleep modes of operation, the common bus line 520 and the external pin 522 are coupled to a read voltage VREAD according to an embodiment of the present invention. The read voltage VREAD may be more or less or approximately equal to Vcc. The read voltage VREAD is supplied from a source external to the circuits 500 through the external pin 522, and this is called supply stealing.

The elevated voltage and the read voltage VREAD are coupled to the common bus line 230 or the common bus line 520 from a driver circuit instead of the external pins 220 or 522 according to alternate embodiments of the present invention. The driver circuit is located in the antifuse bank 200 or the circuits 500. The entire disclosure of U.S. application Ser. No. 09/652,429 entitled GATE DIELECTRIC ANTIFUSE CIRCUITS AND METHODS FOR OPERATING SAME and filed on Aug. 31, 2000, is incorporated herein by reference. The application Ser. No. 09/652,429 discloses a driver circuit and other circuits that are used with and coupled to the circuits described herein according to alternate embodiments of the present invention.

The read circuit 511 generates the output signal OUTPUT in the following manner. The pass-gate transistor 550 is switched off and the transistor 554 is switched on during the sleep mode by the sleep signal ZZ*. The gate of the transistor 552 is coupled through the transistor 554 to Vcc to switch on the transistor 552 to generate a low OUTPUT signal at the drain of the transistor 552.

The pass-gate transistor 550 is switched on and the transistor 554 is switched off during the active mode by the sleep signal ZZ*. One of the transistors 543 and 545 is also switched on during the active mode by the control logic circuit CTLG 544 or CTLT 546 to draw current through the transistor 540, which is always switched on, to Vss. The HVT 524 is switched on by the gate bias circuit 508 during the active mode.

The state of the antifuse 516 is read in the following manner. If the antifuse 516 is programmed and has a low impedance, a voltage that is approximately VREAD less a threshold voltage $V_T$ of the HVT 524 will be coupled to the gate of the transistor 552 to switch it on to couple the drain of the transistor 552 to Vss and generate a low OUTPUT signal. If the antifuse 516 is unprogrammed it will have a high impedance and its dielectric will substantially insulate the read circuit 511 from VREAD on the common bus line 520. The transistor 543 or the transistor 545 that is switched on during the active mode will draw current from the read circuit 511 through the transistor 540 to Vss to leave a low voltage coupled to the gate of the transistor 552. The transistor 552 is switched off, and the drains of the transistors 552 and 556 are coupled to Vcc through the transistor 556 to generate a high OUTPUT signal to indicate that the antifuse 516 is unprogrammed.

Figure 5B:
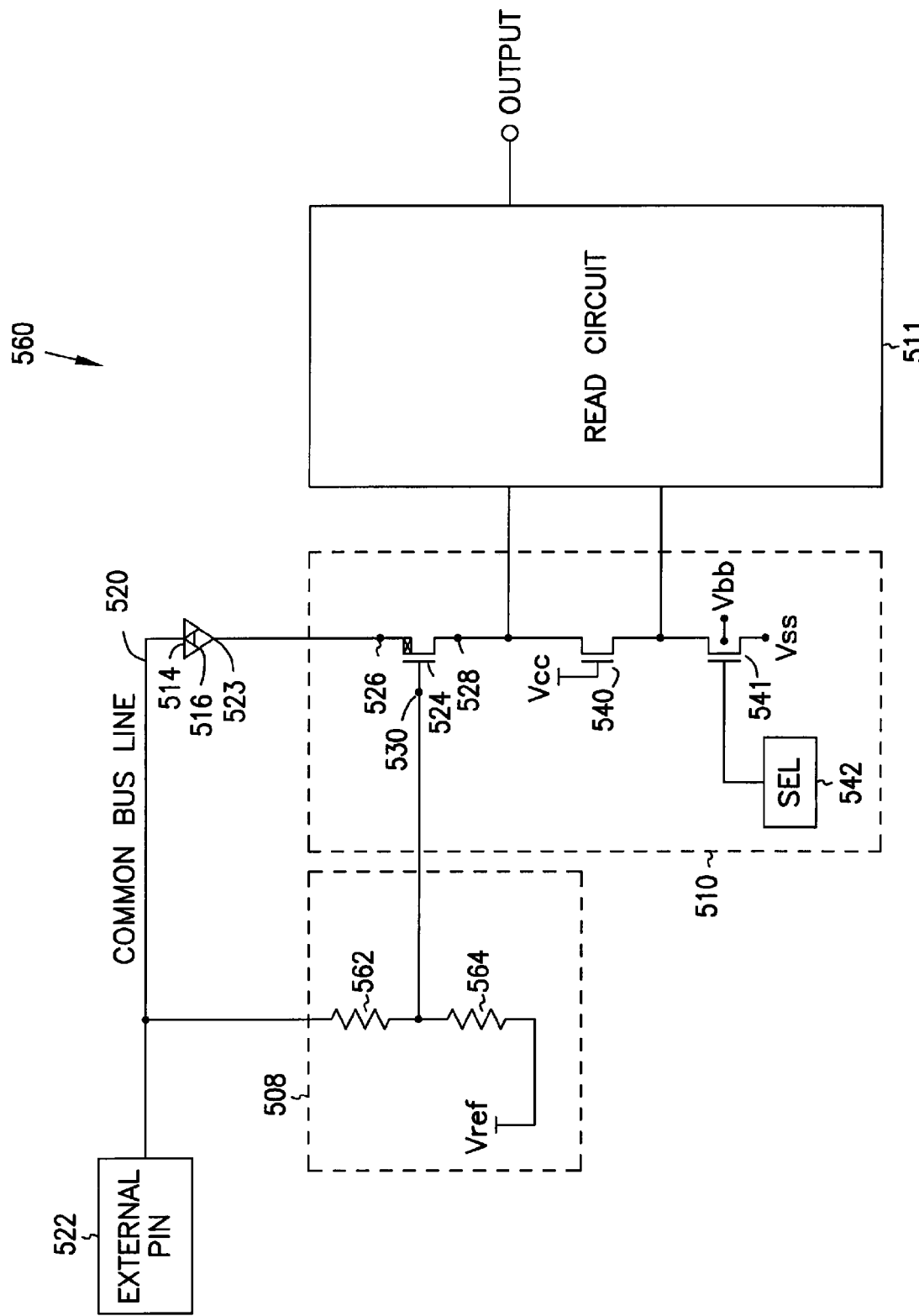
FIG. 5B is an electrical schematic diagram of support circuits for antifuses according to an embodiment of the present invention.

Several of the circuits in the antifuse bank 200 shown in FIG. 2 are shown in greater detail in FIG. 5B. An electrical schematic diagram of several support circuits 560 for programming and reading antifuses is shown in FIG. 5B according to an embodiment of the present invention. The circuits 560 have many elements that are similar to the elements of the circuits 500 shown in FIG. 5A. Elements common to both of the circuits 500 and 560 have been given the same reference numerals and will not be described, and the details of the read circuit 511 have not been shown, for purposes of brevity.

The gate bias circuit 508 shown in FIG. 5A is shown in more detail in FIG. 5B. The gate bias circuit 508 includes a first impedance 562 coupled between the common bus line 520 and the gate terminal 530 of the HVT 524. The gate bias circuit 508 also includes a second impedance 564 coupled between the gate terminal 530 and a reference voltage Vref The first impedance 562 and the second impedance 564 form a voltage divider and couple a voltage between Vref and VREAD to the gate terminal 530 during the active mode and the sleep mode. Vref could be Vcc or Vss or any voltage between them. VREAD is on the common bus line 520 during the active mode and the sleep mode and may be more or less or approximately equal to Vcc. The first impedance 562 and the second impedance 564 couple a voltage between Vref and the elevated voltage to the gate terminal 530 during the programming mode of operation when the elevated voltage is on the common bus line 520. The voltage on the gate terminal 530 during the programming mode is determined by a ratio of the impedances 562 and 564, and this ratio is selected to protect the HVT 524 as will be described hereinbelow. The first impedance 562 and the second impedance 564 may each be a resistor or a transistor or other electric or electronic element that provides an electrical impedance. The first impedance 562 and the second impedance 564 may comprise a combination of different types of impedances such as a combination of a resistor and a transistor or multiple resistors and transistors or various combinations of resistors, transistors, and other elements that provide an electrical impedance.

Figure 5C:
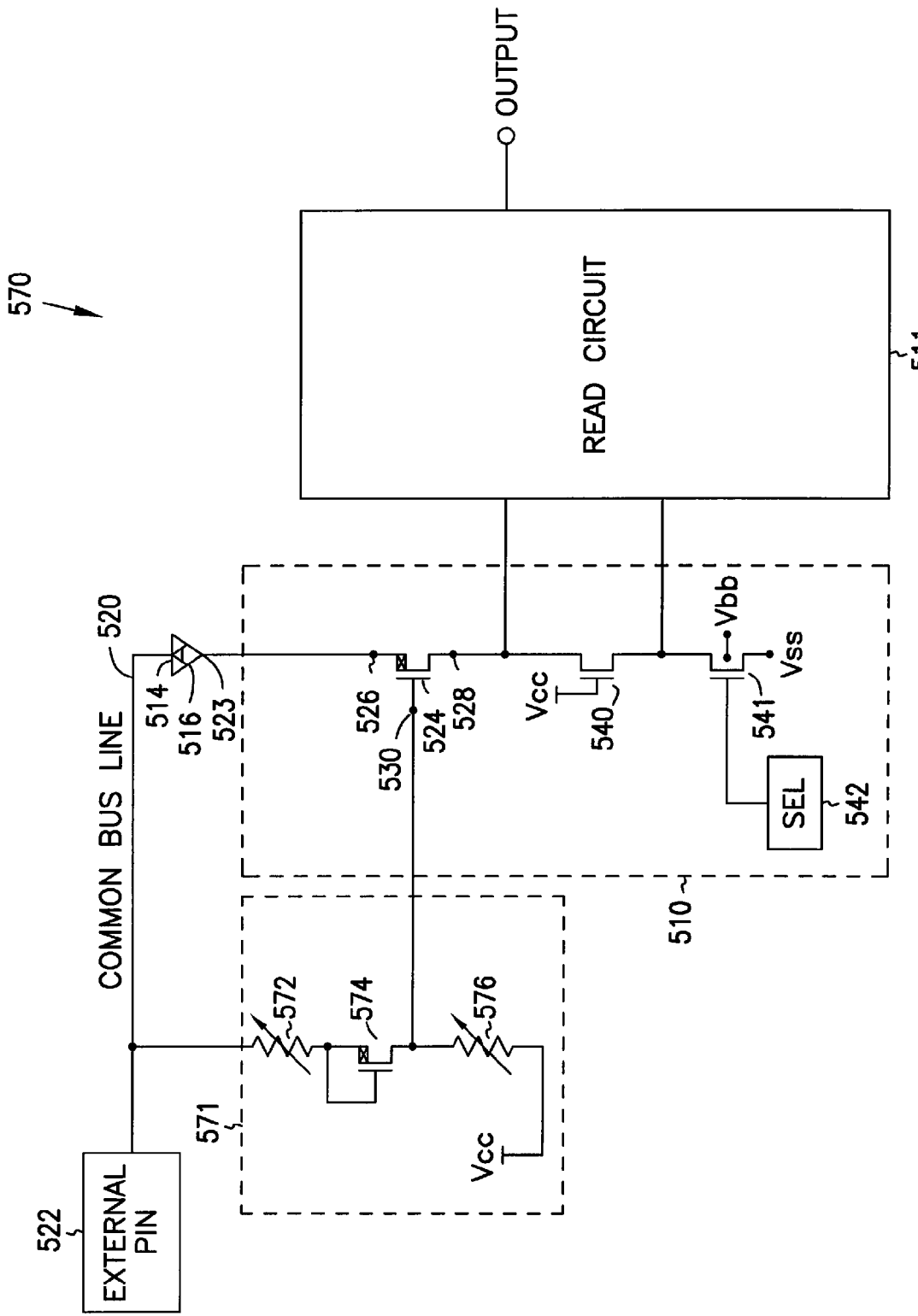
FIG. 5C is an electrical schematic diagram of support circuits for antifuses according to an embodiment of the present invention.

Several of the circuits in the antifuse bank 200 shown in FIG. 2 are shown in greater detail in FIG. 5C. An electrical schematic diagram of several support circuits 570 for programming and reading antifuses is shown in FIG. 5C according to an embodiment of the present invention. The circuits 570 have many elements that are similar to the elements of the circuits 560 shown in FIG. 5B, and elements common to both of the circuits 560 and 570 have been given the same reference numerals and will not be described for purposes of brevity. The circuits 570 of FIG. 5C include a gate bias circuit 571 according to another embodiment of the present invention that replaces the gate bias circuit 508 shown in FIGS. 5A and 5B.

The gate bias circuit 571 includes a first adjustable resistor 572 and a HVT 574 coupled in series between the common bus line 520 and the gate terminal 530 of the HVT 524. A gate and a drain of the HVT 574 are coupled together to the first adjustable resistor 572 and a source of the HVT 574 is coupled to the gate terminal 530 such that the HVT 574 is diode-connected. The gate bias circuit 571 also includes a second adjustable resistor 576 coupled between the gate terminal 530 and Vcc. The first adjustable resistor 572, the HVT 574, and the second adjustable resistor 576 form a voltage divider. The first adjustable resistor 572, the HVT 574, and the second adjustable resistor 576 couple a voltage of between Vcc and VREAD to the gate terminal 530 during the active and sleep modes of operation when VREAD is on the common bus line 520. The first adjustable resistor 572, the HVT 574, and the second adjustable resistor 576 couple a voltage between Vcc and the elevated voltage to the gate terminal 530 during the programming mode when the elevated voltage is on the common bus line 520. The voltage on the gate terminal 530 during the programming mode is determined by a ratio of the impedances of the first adjustable resistor 572, the HVT 574, and the second adjustable resistor 576, and this ratio is selected to protect the HVT 524 as will be described hereinbelow. The first adjustable resistor 572 and the second adjustable resistor 576 may comprise a combination of different types of impedances such as a combination of a resistor and a transistor or multiple resistors and transistors or various combinations of resistors, transistors, and other elements that provide an electrical impedance.

A voltage sweep of the antifuse 516 may be carried out in the following manner once the antifuse 516 has been programmed to determine its resistive characteristics. The transistors 543 and 545 (shown in FIG. 5A) are switched off, and the transistor 541 is switched on by the logic circuit SEL 542 to control current flow through the program driver circuit 510 to Vss. A voltage on the common bus line 520 is varied and current on the common bus line 520 that passes through the program driver circuit 510 is measured to determine the current/voltage characteristics of the programmed antifuse 516. The voltage on the common bus line 520 is varied above or below Vss such that data for the voltage sweep is obtained for voltages near Vss. The gate terminal 530 of the HVT 524 is maintained at approximately Vcc by the gate bias circuit 571 so that the resistance of the HVT 524 remains relatively unchanged during the sweep, and the diode-connected HVT 574 substantially prevents current flow from the gate bias circuit 571 to the common bus line 520 during the voltage sweep.

With reference to the antifuse bank 200 shown in FIG. 2, once one of the antifuses such as the antifuse 210 in the antifuse bank 200 is programmed, it is an impedance element similar to a resistor, and provides a possible current path for current on the common bus line 230. It is desirable to limit current on the common bus line 230, and therefore additional sources of current on the common bus line 230 are to be substantially eliminated as far as is possible.

Each of the gate bias circuits 508 and 571 shown in FIGS. 5A, 5B, and 5C help to substantially reduce current flow through the HVT 524 from the common bus line 520 during the programming mode when the common bus line 520 is at the elevated voltage and the antifuse 516 is programmed. The elevated voltage may induce breakdown current in the HVT 524, and this does not occur through its substrate because of the high drain breakdown voltage of the HVT 524.

Each of the gate bias circuits 508 and 571 may substantially prevent breakdown current across the gate dielectric of the HVT 524 during the programming mode. An example is illustrated with reference to the transistor 400 and the circuits 560 shown in FIGS. 4 and 5B. The drain terminal 526 is connected to the drain diffusion region 432, the gate terminal 530 is connected to the electrode 424, and the source terminal 528 is connected to the source diffusion region 430. The voltage at the electrode 424 is insulated from the voltage at the drain diffusion region 432 by the gate dielectric 422. However, current will flow across the gate dielectric 422 if a voltage differential between the drain diffusion region 432 and the electrode 424 is large. The gate dielectric 422 may even break down and become a resistive element if the voltage differential is large enough.

The gate bias circuit 508 in the circuits 500 and 560 raises the gate terminal 530 to a voltage between Vref and the elevated voltage during the programming mode, such that a voltage difference across the gate dielectric 422 is too small to induce current flow through the gate dielectric 422 to the electrode 424. The gate bias circuit 508 thereby reduces damage to the gate dielectric 422 by reducing the voltage drop across the gate dielectric 422 when the antifuse 516 is programmed and the common bus line 520 is at the elevated voltage. If the gate terminal 530 were held at a lower voltage such as Vref, then the large voltage differential might cause continuous current and damage the gate dielectric 422 when the drain terminal 526 was near the elevated voltage. Similarly, the gate bias circuit 571 in the circuits 570 raises the gate terminal 530 to a voltage between Vcc and the elevated voltage during the programming mode.

The voltage on the gate terminal 530 during the programming mode is determined by the ratio of the impedances 562 and 564 in the gate bias circuit 508, or by the ratio of the impedances of the first adjustable resistor 572, the HVT 574, and the second adjustable resistor 576 in the gate bias circuit 571. The ratios of these impedances are selected such that the voltage on the gate terminal 530 during the programming mode is high enough such that a voltage difference across the gate dielectric 422 in the HVT 524 is too small to induce current flow through the gate dielectric 422 after the antifuse 516 has been programmed, but not so high as to damage the gate dielectric 422 when the antifuse 516 is being programmed. With reference to FIG. 6 and its description above, a voltage at the source terminal 528 of the HVT 524 is nearly Vss during the percolation period 604 when the antifuse 516 is intact. If the voltage on the gate terminal 530 during the programming mode is too high, current may flow between the source diffusion region 430 and the electrode 424 across the gate dielectric 422, and the gate dielectric 422 may break down. The ratio of the impedances 562 and 564 in the gate bias circuit 508, or the ratio of the impedances of the first adjustable resistor 572, the HVT 574, and the second adjustable resistor 576 in the gate bias circuit 571, are selected such that the voltage on the gate terminal 530 during the programming mode is low enough to substantially prevent current flow across the gate dielectric 422 when the antifuse 516 is being programmed, and is high enough to substantially prevent current flow across the gate dielectric 422 after the antifuse 516 has been programmed.

The program driver circuit 510 shown in FIGS. 5A, 5B, and 5C is different in alternate embodiments of the present invention. For example, different circuits 510 have different HVTs, or one may have a cascode coupling of transistors 540 and 541 and the other may have only a single corresponding transistor 541. Different circuits 510 have different gate bias circuits such as those described with reference to FIGS. 5B and 5C according to alternate embodiments of the present invention.

Figure 7:
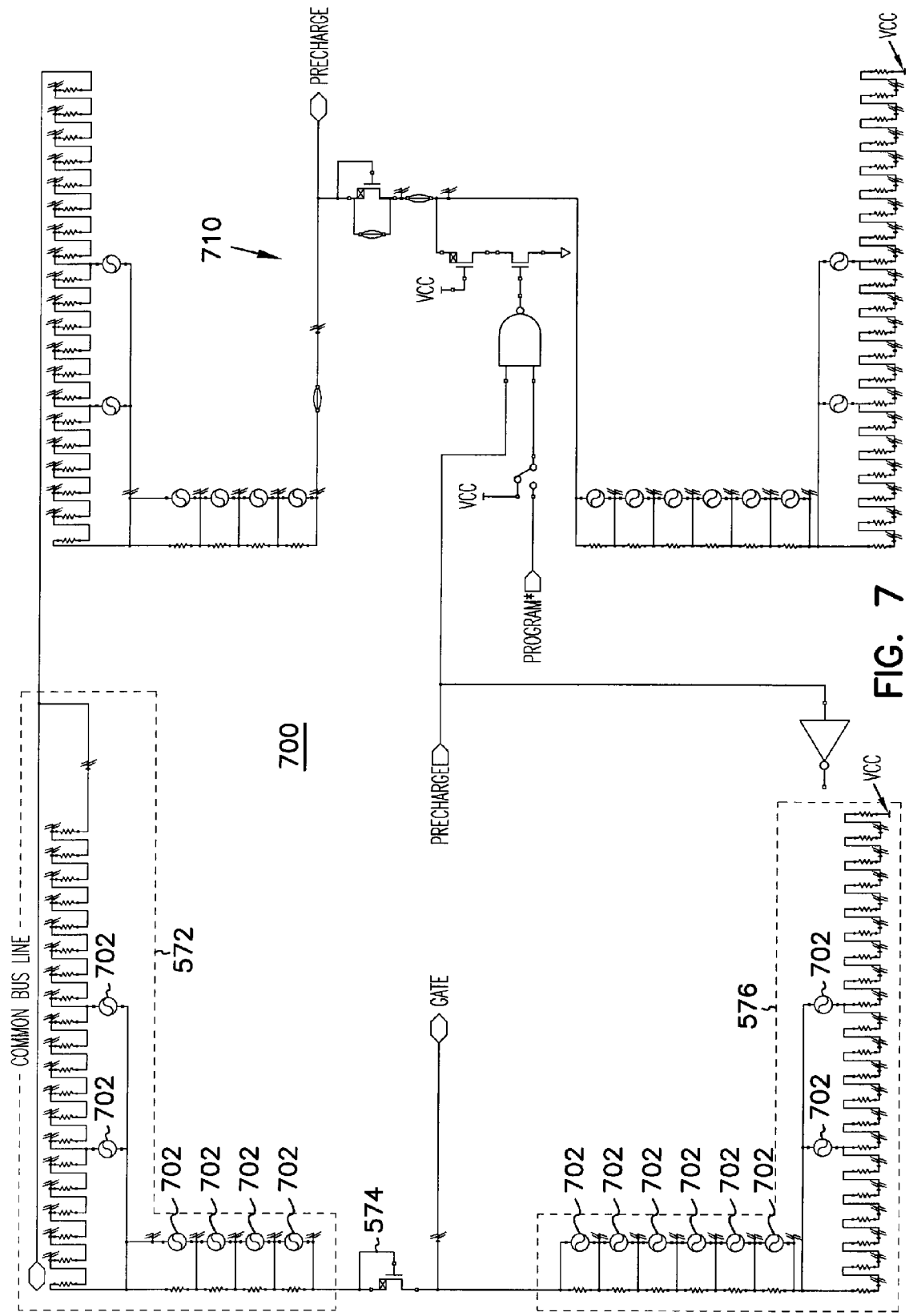
FIG. 7 is an electrical schematic diagram of support circuits for antifuses according to an embodiment of the present invention.

An electrical schematic diagram of support circuits 700 for programming and reading antifuses is shown in FIG. 7 according to an embodiment of the present invention. The circuits 700 show in greater detail the first adjustable resistor 572, the HVT 574, and the second adjustable resistor 576 shown in FIG. 5C. Each of the first adjustable resistor 572 and the second adjustable resistor 576 comprise resistors formed in parallel with fuses 702. The fuses 702 are short circuit connections that can be evaporated by a laser beam to create open circuits during the manufacture of an integrated circuit. One or more of the fuses 702 are evaporated by the laser beam to set the impedance values of the first adjustable resistor 572 and the second adjustable resistor 576 to determine the voltage applied to the gate 530 of the HVT 524 during the programming mode of operation. The impedance values of the first adjustable resistor 572 and the second adjustable resistor 576 can also be set with a metal mask in a fabrication process that selects metal options to shunt the resistors according to alternate embodiments of the present invention. Other elements 710 in the circuits 700 comprise a precharge circuit receiving precharge and program signals.

Figure 8:
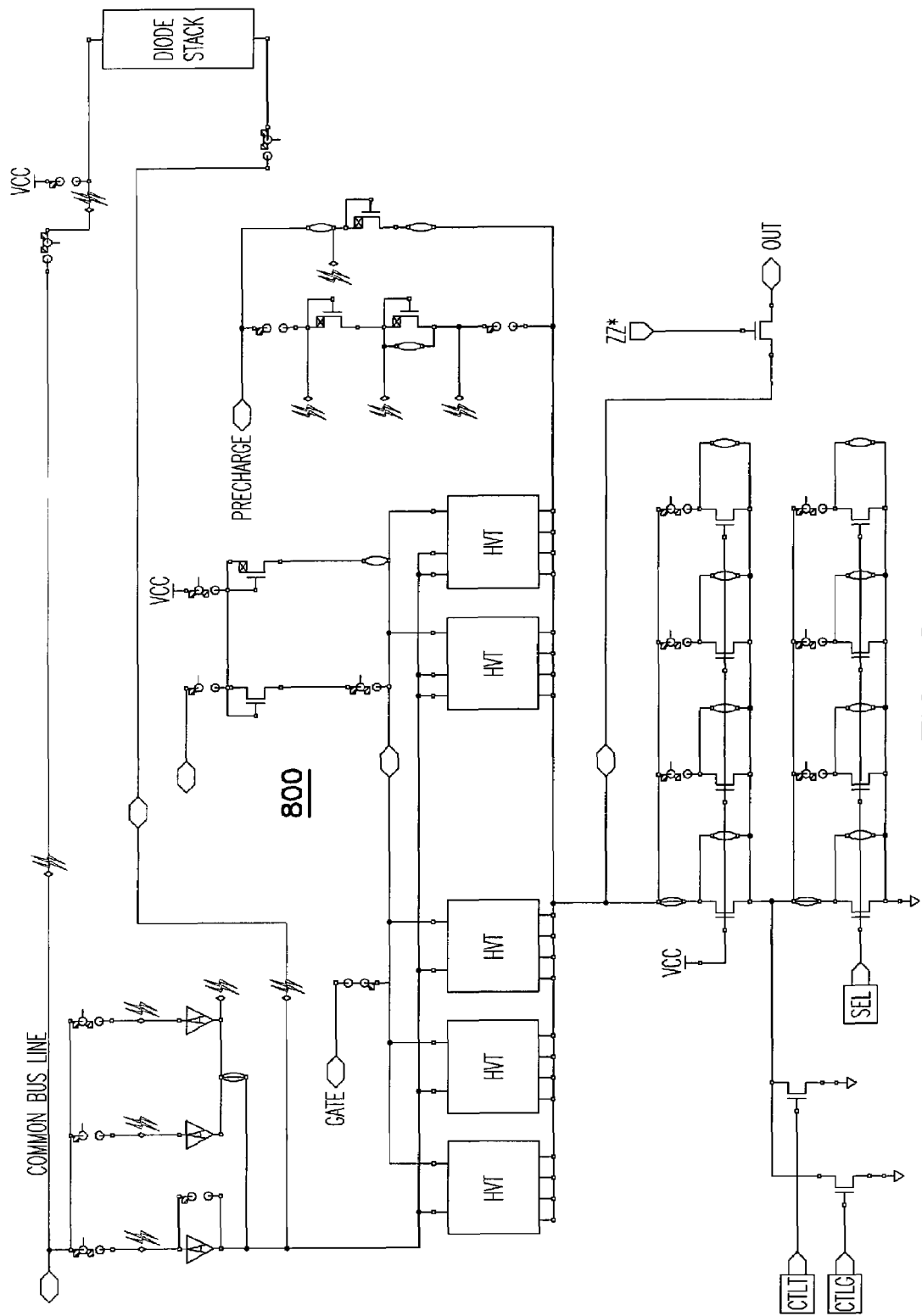
FIG. 8 is an electrical schematic diagram of support circuits for antifuses according to an embodiment of the present invention.

An electrical schematic diagram of support circuits 800 for programming and reading antifuses is shown in FIG. 8 according to an embodiment of the present invention. The circuits 800 show an alternative embodiment of the program driver circuit 510 and the read circuit 511 shown in FIG. 5A. The circuits 800 also include a precharge circuit receiving a precharge signal and a diode stack coupled in parallel with antifuses.

Figure 9:
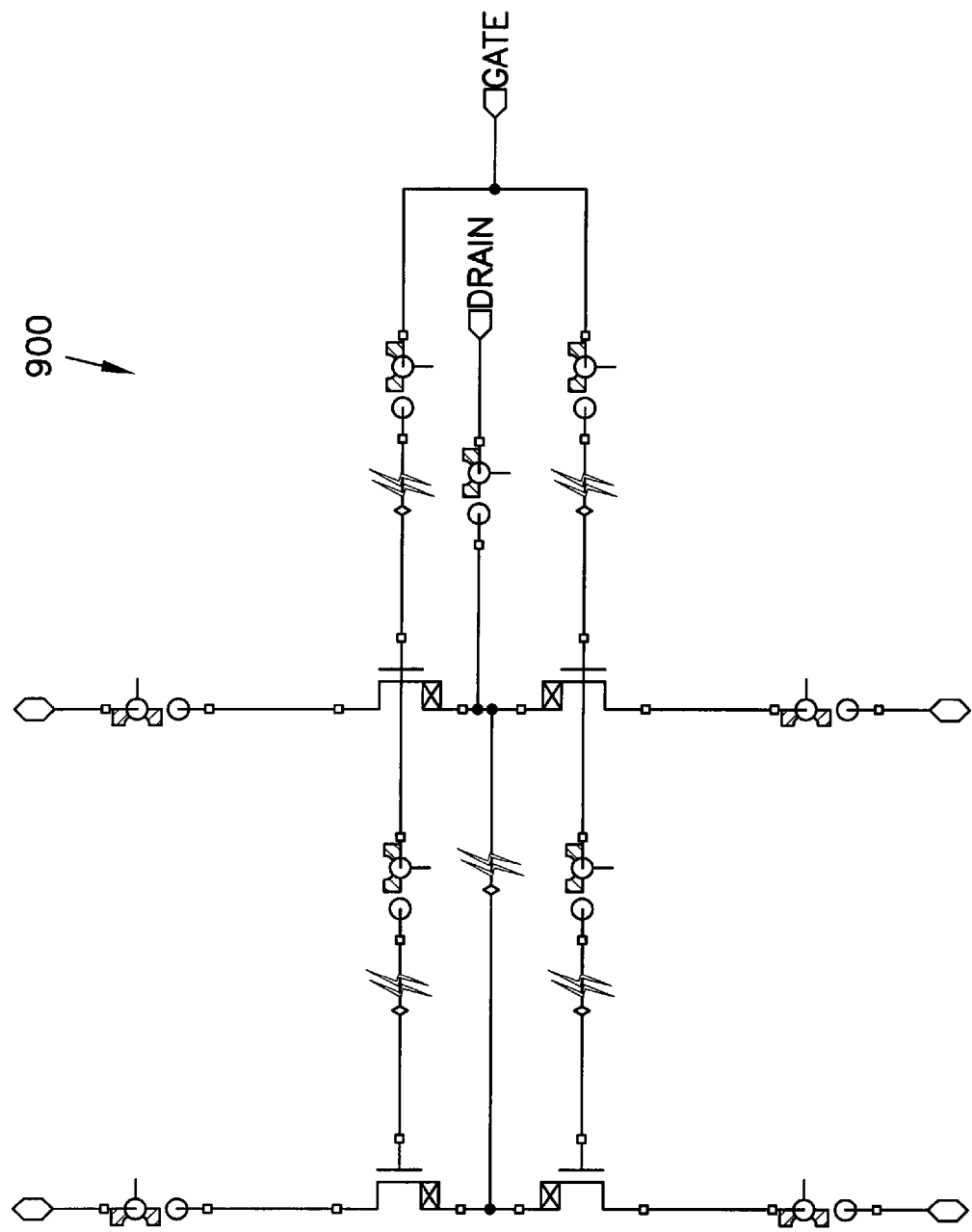
FIG. 9 is an electrical schematic diagram of support circuits for antifuses according to an embodiment of the present invention.

An electrical schematic diagram of support circuits 900 for programming and reading antifuses is shown in FIG. 9 according to an embodiment of the present invention. The circuits 900 show in greater detail HVTs that are shown in FIG. 8.

Figure 10:
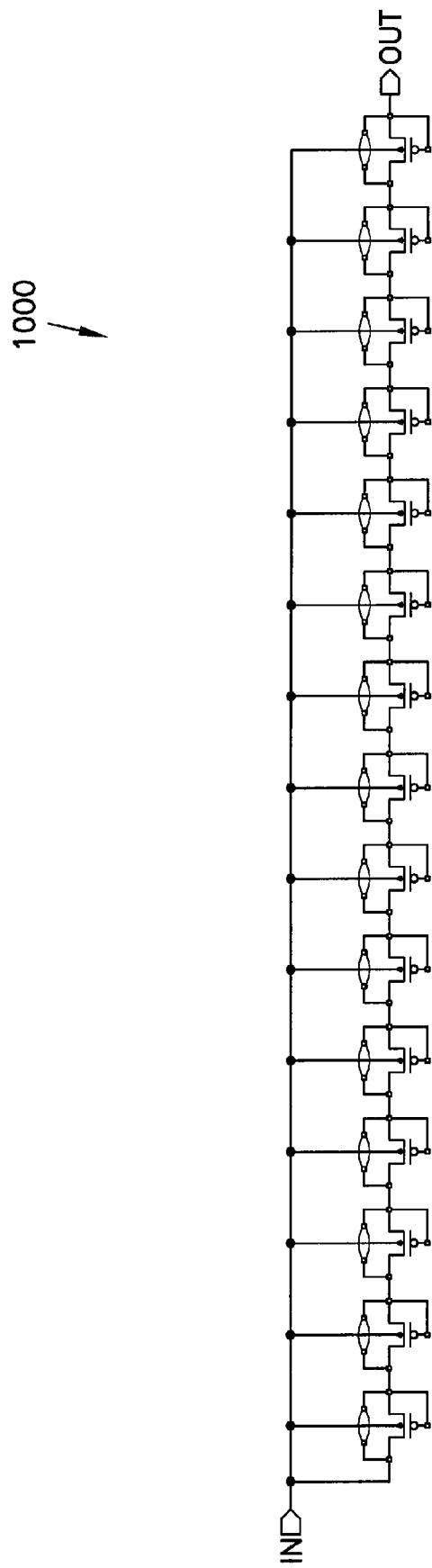
FIG. 10 is an electrical schematic diagram of support circuits for antifuses according to an embodiment of the present invention.

An electrical schematic diagram of support circuits 1000 for programming and reading antifuses is shown in FIG. 10 according to an embodiment of the present invention. The circuits 1000 show in greater detail the diode stack that is shown in FIG. 8.

Figure 11:
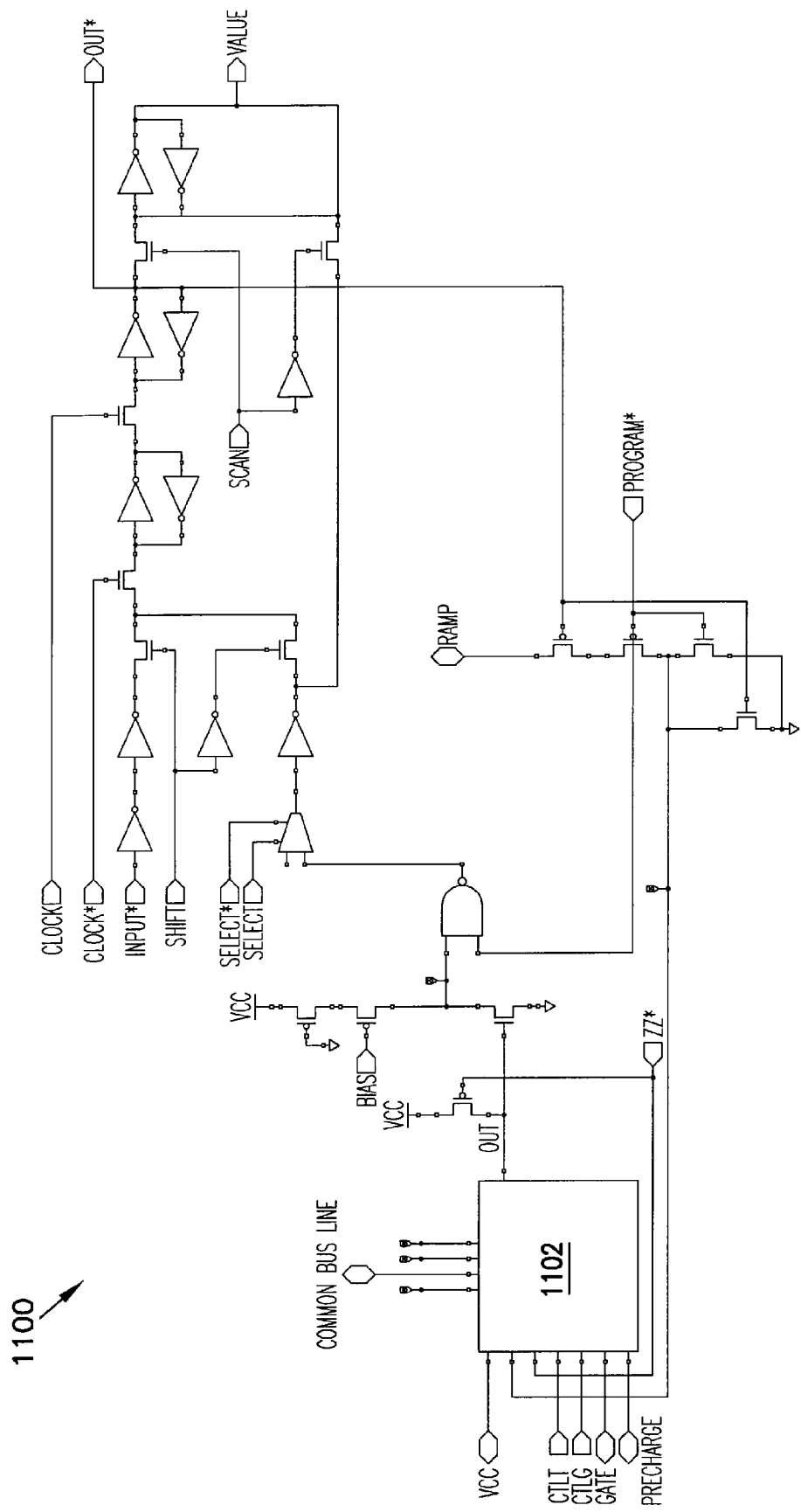
FIG. 11 is an electrical schematic diagram of support circuits for anti fuses according to an embodiment of the present invention.

An electrical schematic diagram of support circuits 1100 for programming and reading antifuses is shown in FIG. 11 according to an embodiment of the present invention. The circuits 1100 show the program driver circuit 510 and the read circuit 511 shown in FIG. 5A in a block 1102 with additional circuits used to select and program antifuses.

The embodiments of the present invention shown and described herein improve the noise margin of integrated circuits.

The antifuse 100 shown in FIG. 1 and the transistors 300 and 400 shown in FIGS. 3 and 4 according to embodiments of the present invention may be formed in wells within other wells or tanks rather than the substrates shown. Such wells or tanks may be situated with other wells or tanks, or within other wells or tanks, in a larger substrate. The wells or tanks may also be situated in a silicon-on-insulator (SOI) device.

Circuits shown and described herein according to embodiments of the present invention, including the circuits shown in FIGS. 5A, 5B, and 5C, include one or more HVTs. The same type of HVT is used several times in the same circuit, or combinations of the different HVTs 300 and 400 shown and described with reference to FIGS. 3 and 4 are used in the same circuit in alternate embodiments of the present invention.

An integrated circuit fabricated with one or more of the antifuses and circuits described above is tested in a test mode. For example, an integrated circuit having a bank of antifuses is prestressed by applying a prestress voltage that is less than the elevated voltage used to program the antifuses. The antifuses are exposed to the prestress voltage and weaker antifuses are programmed as a result. The antifuses are then read to indicate the antifuses that have been programmed. The antifuses may be read by determining their analog resistances, by detecting a digital output of an addressed antifuse, or by detecting digital output from an addressed antifuse compared with several different load elements.

The entire disclosure of U.S. application Ser. No. 09/652,429 entitled GATE DIELECTRIC ANTIFUSE CIRCUITS AND METHODS FOR OPERATING SAME and filed on Aug. 31, 2000, now U.S. Pat. No. 6,630,724, is incorporated herein by reference. The application Ser. No. 09/652,429 discloses circuits such as read circuits and driver circuits that may be used with and coupled to the embodiments of the present invention described herein.

Figure 12:
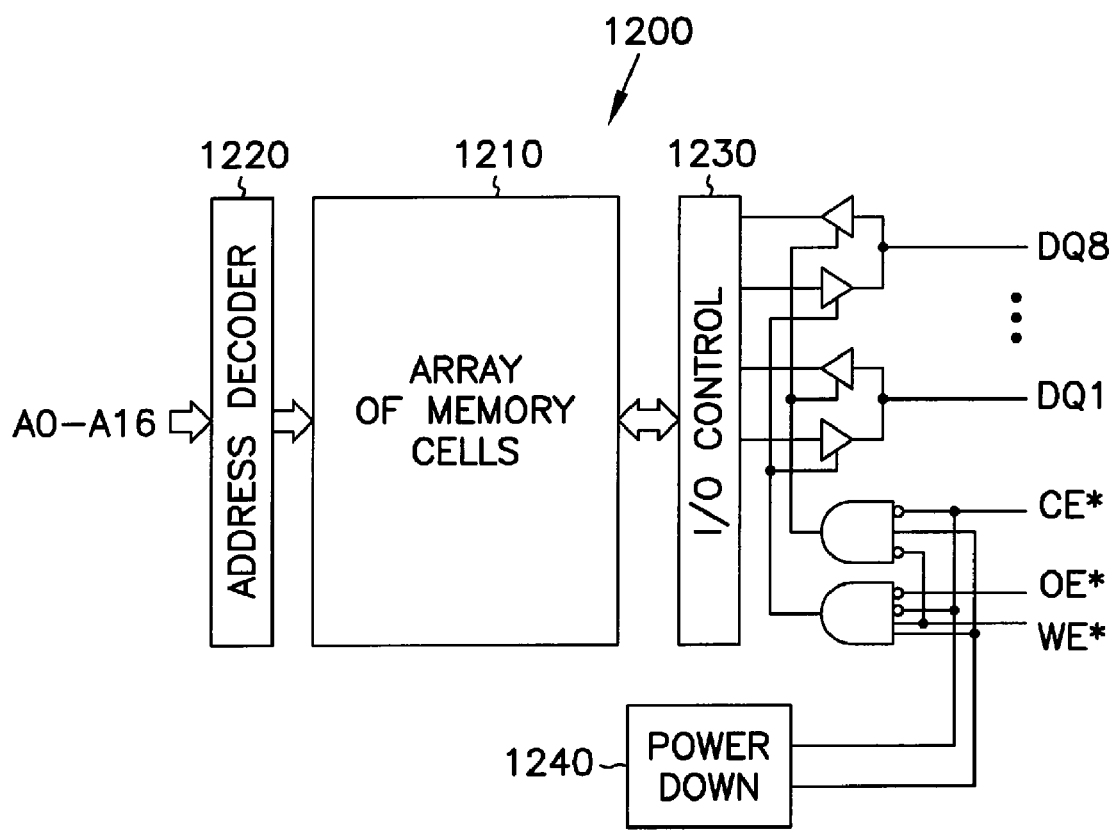
FIG. 12 is a block diagram of a static random access memory device according to an embodiment of the present invention.

A block diagram of a static random access memory device (SRAM) 1200 is shown in FIG. 12 according to an embodiment of the present invention. The SRAM 1200 may include one or more of the circuits and devices described above with respect to FIGS. 1-11 according to embodiments of the present invention. The SRAM 1200 has an array 1210 of memory cells that are accessed according to address signals provided to the SRAM 1200 at a number of address inputs A0-A16. An address decoder 1220 decodes the address signals and accesses memory cells in the array 1210 according to the address signals. Data is written to the memory cells in the array 1210 when a write enable signal WE* and a chip enable signal CE* coupled to the SRAM 1200 are both low. The data is received by the SRAM 1200 over eight data input/output (I/O) paths DQ1-DQ8. The data is coupled to the memory cells in the array 1210 from the I/O paths DQ1-DQ8 through an I/O control circuit 1230. Data is read from the memory cells in the array 1210 when the write enable signal WE* is high and an output enable signal OE* coupled to the SRAM 1200 and the chip enable signal CE* are both low. A power down circuit 1240 controls the SRAM 1200 during a power-down mode. The circuits and devices described above with respect to FIGS. 1-11 according to embodiments of the present invention may be included in other types of memory devices such as DRAMs, programmable logic devices, PROMs, EPROMs, and EEPROMs.

Figure 13:
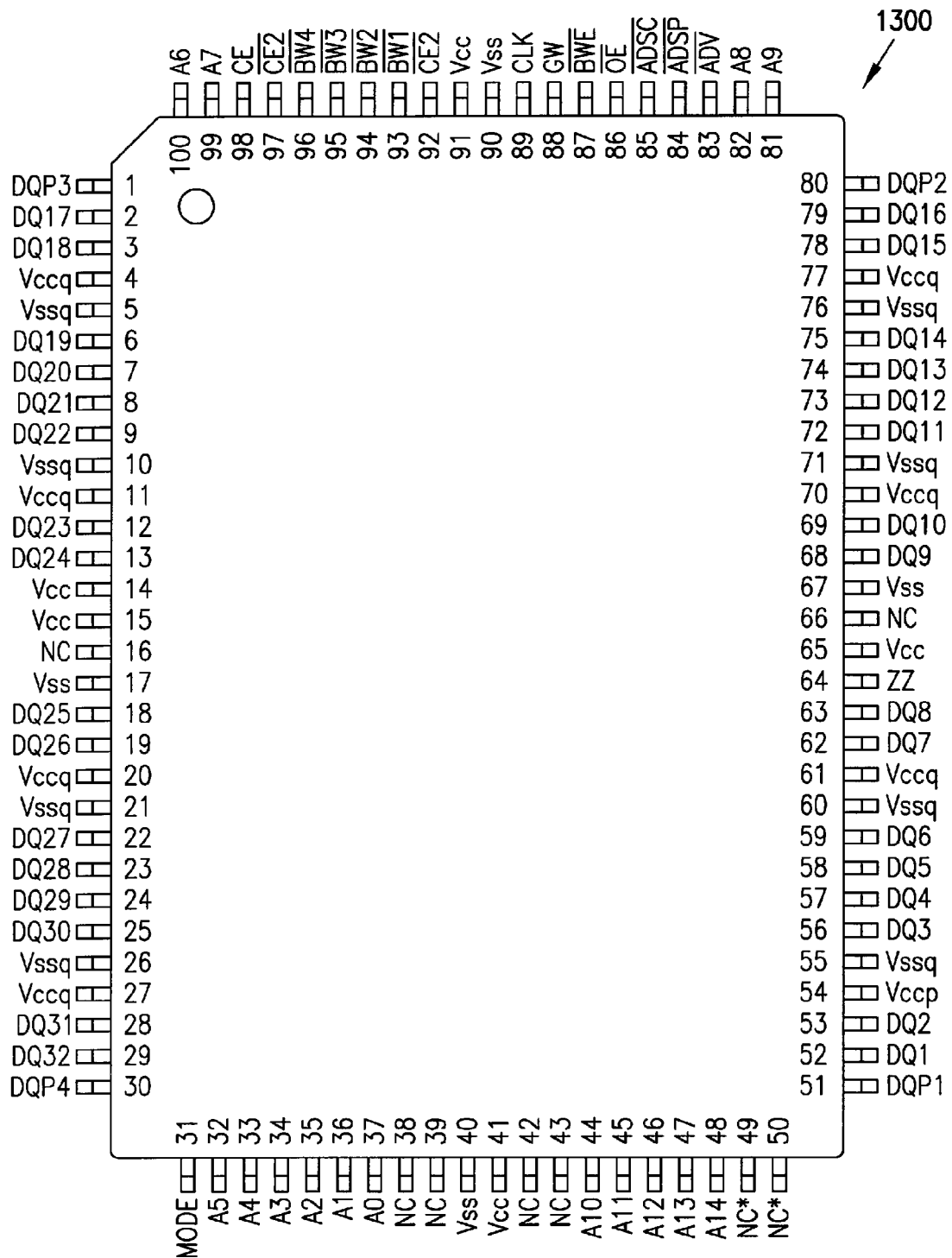
FIG. 13 is an electrical schematic diagram of an integrated circuit package according to an embodiment of the present invention.

An integrated circuit package 1300 of a 32 k×36 SRAM memory device is shown in FIG. 13 according to an embodiment of the present invention. The SRAM may include one or more of the circuits and devices described above with respect to FIGS. 1-11 according to embodiments of the present invention. One of the external pins 220 or 522 described above is one of several pins 16, 38, 39, 42, 43, or 66 in the package 1300. The pins 16, 38, 39, 42, 43, or 66 are non-reserved pins, one of which is used as one of the external pins 220 or 522. The pin selected as one of the external pins 220 or 522 will be coupled to an elevated voltage if an antifuse in the SRAM is to be programmed. The selected pin may be left floating, or may be coupled to the read voltage VREAD during a normal operation of the SRAM.

Figure 14:
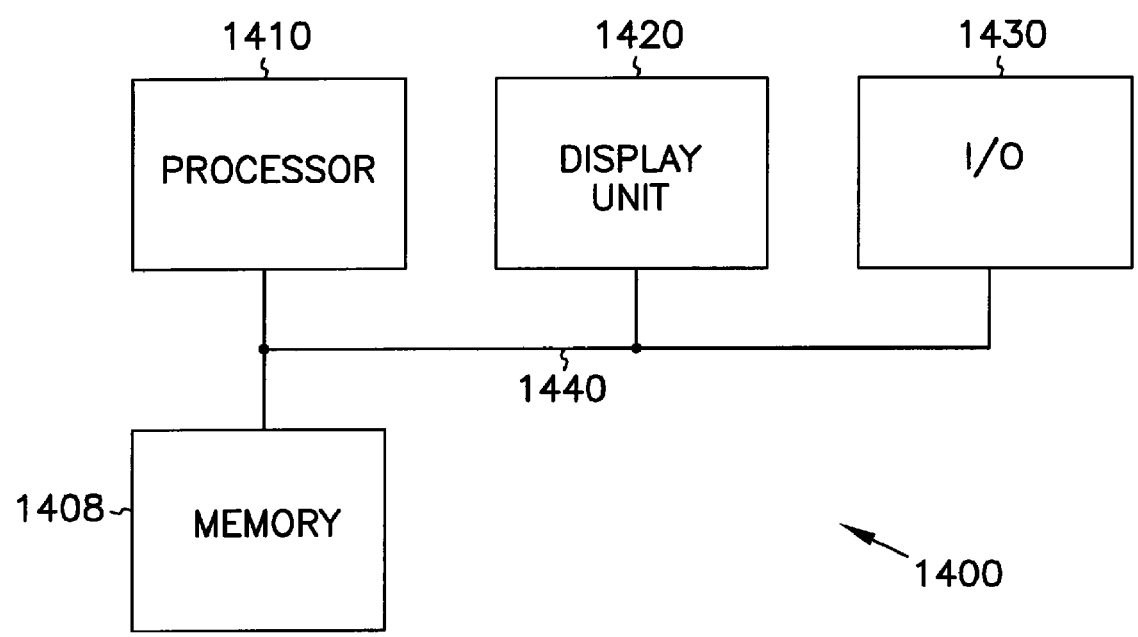
FIG. 14 is a block diagram of an information-handling system according to an embodiment of the present invention.

A block diagram of an information-handling system 1400 is shown in FIG. 14 according to an embodiment of the present invention. The information-handling system 1400 includes a memory system 1408, a processor 1410, a display unit 1420, and an input/output (I/O) subsystem 1430. The processor 1410 may be, for example, a microprocessor. One or more of the memory system 1408, the processor 1410, the display unit 1420, and the I/O subsystem 1430 may include one or more of the circuits and devices described above with respect to FIGS. 1-11 according to embodiments of the present invention. The processor 1410, the display unit 1420, the I/O subsystem 1430, and the memory system 1408 are coupled together by a suitable communication line or bus 1440 over which signals are exchanged between them.

Although specific embodiments have been illustrated and described herein, it will be appreciated by those skilled in the art having the benefit of this description that any equivalent arrangement may be substituted for the specific embodiments shown. For example, specific memory devices have been described and shown in the Figures. One skilled in the art having the benefit of this description will recognize that the embodiments of the present invention may be employed in other types of memory devices and in other types of integrated circuit devices. The voltage Vbb described above may be approximately equal to Vss, or may be negative. In addition, in alternate embodiments of the present invention, the common bus line is sized to provide a programming current for more than one antifuse at the same time. The present invention is therefore limited only by the claims and equivalents thereof.

What is claimed is:

1. An antifuse circuit, comprising:
   a bus;
   an antifuse including a first node connected to the bus;
   a transistor connected to the antifuse, the transistor including a gate; and
   a gate control circuit connected to the gate, wherein the gate control circuit includes a first impedance connected to the bus and the gate and a second impedance connected between a supply voltage and the gate.

2. The circuit of claim 1, wherein the first and second impedances are each adjustable.

3. The circuit of claim 2, wherein the supply voltage is Vcc.

4. The circuit of claim 1, wherein the gate control circuit includes a diode element coupled in series between the bus and the gate of the transistor.

5. The circuit of claim 4, wherein the diode element includes a diode-connected transistor.

6. The circuit of claim 1, wherein the antifuse comprises a layer of oxide between the first node that is coupled to a common bus line and a well in a substrate, the common bus line being coupled to receive the elevated voltage during a programming mode of operation and a read voltage during an active mode of operation.

7. The circuit of claim 1, wherein the transistor includes:
   an n-type well in a p-type substrate;
   an n+-type drain diffusion region in the well comprising a drain coupled to the n-type well;
   an n+-type source diffusion region in the substrate comprising a source;
   a layer of oxide over the substrate; and
   a gate electrode over the layer of oxide.

8. An antifuse circuit, comprising:
   a bus;
   an antifuse including a first node connected to the bus;
   a high voltage, first transistor connected to the antifuse, the first transistor including a gate;
   a gate control circuit connected to the gate, wherein the gate control circuit includes a first impedance connected to the bus and the gate and a second impedance connected between a supply voltage and the gate; and
   a second transistor coupled to the high-voltage, first transistor to control current flowing through the antifuse and the high-voltage, first transistor.

9. The antifuse circuit of claim 8, wherein the second transistor is an n-channel transistor.

10. The antifuse circuit of claim 9, wherein the first transistor is in an n-type well in a p-type substrate.

11. The antifuse circuit of claim 8, wherein the second transistor has a gate connected to a logic select circuit.

12. The antifuse circuit of claim 11, wherein the second transistor includes first source/drain connected to the first transistor through a third transistor.

13. The antifuse circuit of claim 12, wherein the third transistor includes a gate connected to a supply voltage.

14. An antifuse circuit, comprising:
    a bus;
    an antifuse including a first node connected to the bus;
    a high voltage, first transistor including a first source/drain connected to the antifuse, the first transistor including a gate;
    a gate control circuit connected to the gate, wherein the gate control circuit includes a first impedance connected to the bus and the gate and a second impedance connected between a supply voltage and the gate; and
    a read circuit coupled to the high-voltage transistor to read the antifuse during an active mode.

15. The antifuse circuit of claim 14, wherein the read circuit includes a first input connected to a pass-gate transistor, the pass gate transistor includes a gate to receive a sleep signal.

16. The antifuse circuit of claim 15, wherein the sleep signal is an active low signal.

17. The antifuse circuit of claim 16, wherein the first source/drain of the pass-gate transistor is connected to a second source/drain of the first transistor.

18. The antifuse circuit of claim 17, wherein the pass-gate transistor includes a second source/drain is connected to a first source/drain of a second transistor.

19. The antifuse circuit of claim 18, wherein the second transistor is an opposite type of the pass-gate transistor, has a gate connected to the sleep signal, and includes a second source/drain connected to a supply voltage.

20. The antifuse circuit of claim 19, wherein the second source/drain of the first transistor is connected to a first source/drain of a third transistor, wherein a second source/drain of the third transistor is connected to a first source/drain of a fourth transistor, wherein the fourth transistor includes a gate connected to a logic select circuit, and wherein the third transistor includes agate connected to the source voltage.

* * * * *

UNITED STATES PATENT AND TRADEMARK OFFICE
CERTIFICATE OF CORRECTION

| | |
|---|---|
| PATENT NO. | : 7,405,463 B2 |
| APPLICATION NO. | : 11/426523 |
| DATED | : July 29, 2008 |
| INVENTOR(S) | : Marr et al. |

It is certified that error appears in the above-identified patent and that said Letters Patent is hereby corrected as shown below:

In column 16, line 55, in Claim 20, delete "agate" and insert -- a gate --, therefor.

Signed and Sealed this

Seventh Day of October, 2008

JON W. DUDAS
*Director of the United States Patent and Trademark Office*